(12) United States Patent
Liang et al.

(10) Patent No.: US 7,863,143 B2
(45) Date of Patent: Jan. 4, 2011

(54) HIGH PERFORMANCE SCHOTTKY-BARRIER-SOURCE ASYMMETRIC MOSFETS

(75) Inventors: Qingqing Liang, Fishkill, NY (US);
Huilong Zhu, Poughkeepsie, NY (US);
Gregory G. Freeman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 12/113,462

(22) Filed: May 1, 2008

(65) Prior Publication Data

US 2009/0273040 A1 Nov. 5, 2009

(51) Int. Cl.
*H01L 21/336* (2006.01)
(52) U.S. Cl. ............... 438/286; 257/E21.425; 257/E21.634; 438/149
(58) Field of Classification Search ......... 257/347, 257/E21.425, E21.634; 438/149, 286
See application file for complete search history.

(56) References Cited

U.S. PATENT DOCUMENTS

| | | | | |
|---|---|---|---|---|
| 4,277,883 | A * | 7/1981 | Kaplan | 438/149 |
| 5,973,363 | A * | 10/1999 | Staab et al. | 257/347 |
| 6,057,555 | A * | 5/2000 | Reedy et al. | 257/9 |
| 6,803,613 | B2 * | 10/2004 | Ikeda et al. | 257/288 |
| 2002/0175374 | A1* | 11/2002 | Iwata et al. | 257/347 |
| 2003/0008444 | A1* | 1/2003 | Snyder | 438/197 |
| 2003/0034532 | A1* | 2/2003 | Snyder et al. | 257/410 |
| 2005/0051815 | A1* | 3/2005 | Snyder | 257/288 |
| 2008/0012075 | A1* | 1/2008 | Fukuda | 257/347 |
| 2010/0013014 | A1* | 1/2010 | Snyder et al. | 257/347 |

OTHER PUBLICATIONS

Kinoshita, et al. "Ultra Low Voltage Operations in Bulk CMOS Logic Circuits with Dopant Segregated Schottky Source/Drain Transistors", Electron Devices Meeting, 2006. International Volume, Issue, Dec. 11-13, 2006 pp. 1-4.
Pan, et al. "Novel Approach to Reduce Source/Drain Series Resistance in High Performance CMOS Devices Using Self-Aligned CoWP Process for 45nm Node UTSOI Transistors with 20nm Gate Length", VLSI Technology, 2006. Digest of Technical Papers. 2006 pp. 184-185.

* cited by examiner

*Primary Examiner*—Allan R Wilson
(74) *Attorney, Agent, or Firm*—Scully, Scott, Murphy & Presser, P.C.; H. Daniel Schnurmann (57) ABSTRACT

The present invention, in one embodiment, provides a semiconductor device including a semiconducting body including a schottky barrier region at a first end of the semiconducting body, a drain dopant region at the second end of the semiconducting body, and a channel positioned between the schottky barrier region and the drain dopant region. The semiconducting device may further include a gate structure overlying the channel of the semiconducting body. Further, a drain contact may be present to the drain dopant region of the semiconducting body, the drain contact being composed of a conductive material and in direct physical contact with a portion of a sidewall of the semiconducting body having a dimension that is less than a thickness of the semiconducting body in which the drain dopant region is positioned.

16 Claims, 8 Drawing Sheets

FIG. 12 ated from one another by a short channel. The distance
between a source region and drain region is often referred to
as the physical channel length. However, after implantation
and subsequent diffusion of the source region and drain
region, the distance between the source region and drain
region becomes less than the physical channel length, and is
often referred to as the "effective channel length" (Leff).

With increased scaling, as the Leff becomes smaller, a
well-known phenomena, known as "short channel effect"
(SCE) becomes apparent. Generally speaking, SCE impacts
device operation by, inter alia, reducing device threshold
voltages and increasing subthreshold currents. A problem
related to SCE, is the problem of "hot carrier effect" (HCE).
HCE is a phenomena by which hot holes and electrons can
overcome the potential energy barrier between the silicon and
overlying silicon dioxide in order to cause hot carriers to
inject into the gate oxide. HCE thereby relates to carrier
impact at the substrate topography, whereas SCE relates to
carrier impact within the substrate itself.

Additionally, there are significant challenges in designing
the electrical characteristics of semiconductor devices,
wherein the nature of the inverse relationship between resistance and capacitance makes it difficult to minimize the overall parasitic resistance of the semiconductor device, while
also minimizing overall capacitance of the semiconductor
device.

HIGH PERFORMANCE SCHOTTKY-BARRIER-SOURCE ASYMMETRIC MOSFETS

FIELD OF THE INVENTION

The present invention relates to semiconductor devices and methods of forming semiconductor devices. More particularly, the present invention relates to schottky barriers utilized in semiconductor devices.

BACKGROUND OF THE INVENTION

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device.

Very large scale integration (VLSI) processing dictates that active devices be placed close to one another in a dense fashion. As such, dopant regions, i.e., source regions and drain regions, are implanted at a shallow depth, and are separated from one another by a short channel. The distance between a source region and drain region is often referred to as the physical channel length. However, after implantation and subsequent diffusion of the source region and drain region, the distance between the source region and drain region becomes less than the physical channel length, and is often referred to as the "effective channel length" (Leff).

SUMMARY

In one aspect, the present invention provides a semiconductor device in which the source-channel and source-body capacitance of the semiconductor device is substantially reduced by the incorporation of a schottky barrier to a first end of semiconducting body, and the space charge area is substantially reduced by the incorporation of a reduced area junction to a drain dopant region that is positioned at an opposing end of the semiconductor body.

Broadly, the present invention provides a semiconductor device that includes:

a semiconducting body including a schottky barrier region at a first end of the semiconducting body, a drain dopant region at the second end of the semiconducting body, and a channel positioned between the schottky barrier region and the drain dopant region;

a gate structure overlying the channel of the semiconducting body;

a drain contact to the drain dopant region of the semiconducting body, the drain contact being composed of a conductive material in direct physical contact with a portion of a sidewall of the semiconducting body and having a dimension that is less than a thickness of the semiconducting body in which the drain dopant region is positioned.

In another aspect, a method of forming a semiconductor device is provided. In one embodiment, the method provides the above described semiconductor device in which the source-channel capacitance and source-body capacitance of the semiconductor device is substantially reduced by the incorporation of a schottky barrier on a first end of a semiconducting body, and the space charge area is substantially reduced by the incorporation of a reduced area junction to a drain dopant region that is positioned on an opposing end of the semiconductor body.

Broadly, the present invention provides a method that includes the following:

providing a substrate including a semiconducting layer overlying an insulating layer;

forming a gate structure atop the semiconducting layer;

removing portions of the semiconducting layer to provide exposed portions of the insulating layer, wherein a remaining portion of the semiconducting layer provides a semiconducting body underlying the gate structure;

forming dielectric regions on the exposed portions of the insulating layer, wherein the dielectric regions abut the semiconducting body;

removing a portion of the dielectric regions, wherein a remaining portion of the dielectric region is in direct physical contact with a drain dopant region of the semiconducting body;

forming a schottky barrier region on the portion of the semiconducting body that is opposite the drain dopant region; and forming a drain contact to the drain dopant region, wherein the drain contact to the drain dopant region is present overlying the remaining portion of the dielectric region and is in direct physical contact with a drain dopant region of the semiconducting body.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention is directed to novel methods and structures relating to gate structures in semiconducting devices, in which the source-channel and source-body capacitance of the semiconductor device may be substantially reduced by the incorporation of a schottky barrier to a first end of semiconducting body, and the space charge area may be substantially reduced by the incorporation of a reduced area junction to a drain dopant region that is positioned at an opposing end of the semiconductor body. When describing the following structures and methods, the following terms have the following meanings, unless otherwise indicated.

As used herein, "semiconducting body" refers to an intrinsic semiconductor material that has been doped, that is, into which a dopant has been introduced, giving it different electrical properties than the intrinsic semiconductor material. Doping involves adding dopant atoms to an intrinsic semiconductor, which changes the electron carrier concentration and hole carrier concentration of the intrinsic semiconductor. Dominant carrier concentrations in an extrinsic semiconductor classify it as either a p-type or n-type semiconductor.

As used herein, a "P-type" refers to the addition of trivalent impurities that create deficiencies of valence electrons to an intrinsic semiconductor, such as boron, aluminum or gallium to an intrinsic Si substrate.

As used herein, an "N-type" refers to the addition of pentavalent impurities that contributes free electrons to an intrinsic semiconductor substrate, such as antimony, arsenic or phosphorous dopants to an intrinsic Si substrate.

As used herein, a "metal" is an electrically conductive material, wherein in metal atoms are held together by the force of a metallic bond, and the energy band structure of metal's conduction and valence bands overlap, and hence, there is no energy gap.

As used herein, the "insulating" and/or "dielectric" denote a material having a room temperature conductivity of less than about $10^{-10}(\Omega\text{-m})^{-1}$.

A "gate structure" means a structure used to control output current (i.e. flow of carriers in the channel) of a semiconducting device, such as a field effect transistor (FET).

As used herein, "drain dopant region" refers to portions of the semiconducting body in which the electrical conductivity of the material is dependent upon n-type or p-type dopants.

The term "schottky barrier region" denotes a metal-semiconductor junction, in which a metal contact to a moderate doped semiconductor, i.e., having n-type or p-type dopants present in a concentration ranging from about $10^{17}$ to about $10^{19}$ cm$^{-3}$, in which the current (I)/voltage (V) behavior of the metal contact to the moderately doped semiconductor is non-linear, i.e., non-ohmic.

The term "anisotropic etch" denotes a material removal process in which the etch rate in the direction normal to the surface to be etched is greater than in the direction parallel to the surface to be etched.

"Electrically conductive" and/or "electrically communicating" as used through the present disclosure means a material having a room temperature conductivity of greater than $10^{-8}(\Omega\text{-m})^{-1}$.

For purposes of the description hereinafter, the terms "upper", "lower", "right", "left", "vertical", "horizontal", "top", "bottom", and derivatives thereof shall relate to the invention "horizontal", "top", "bottom", and derivatives thereof shall relate to the invention, as it is oriented in the drawing figures. Further, it will be understood that when an element as a layer, region or substrate is referred to as being "atop" or "over" or "overlying" or "below" or "underlying" another element, it can be directly on the other element or intervening elements may also be present. In contrast, when an element is referred to as being "directly on" or "directly over" of in "direct physical contact" with another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
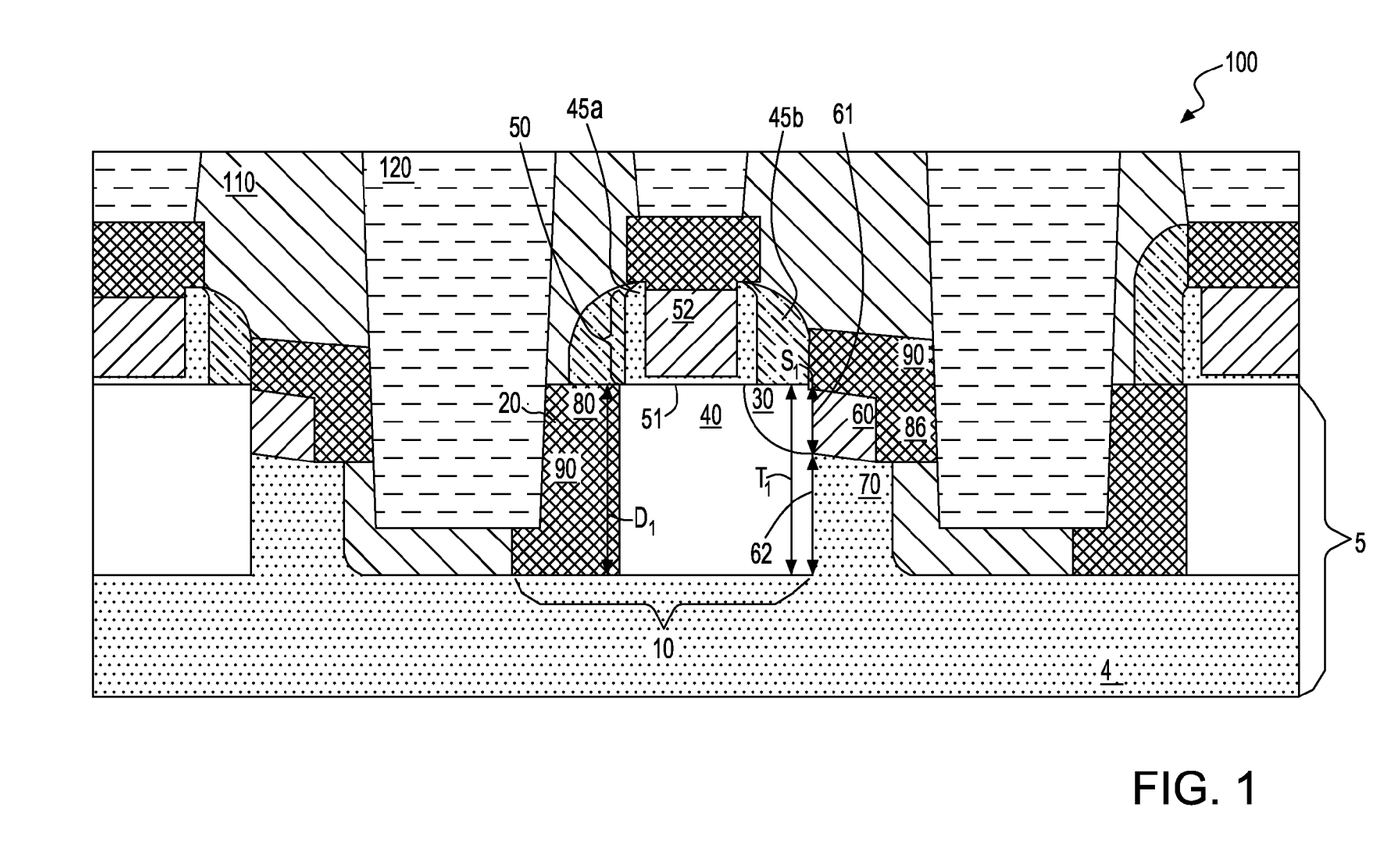
FIG. 1 is a side cross-sectional view of one embodiment of a semiconducting device, as used in accordance the present invention.

FIG. 1 depicts one embodiment of a semiconductor device 100, in which the source-channel and source-body capacitance of the semiconductor device 100 is substantially reduced by the incorporation of a schottky barrier 20 to a first end of semiconducting body 10, and the space charge area is substantially reduced by the incorporation of a reduced area junction, i.e. drain contact 60, to a drain dopant region 30 that is positioned at an opposing end of the semiconductor body 10.

The semiconductor device 100 may include a semiconducting body 10 including a schottky barrier region 20 at a first end of the semiconducting body 10, a drain dopant region 30 at the second end of the semiconducting body 10, and a channel 40 positioned between the schottky barrier region 20 and the drain dopant region 30. A gate structure 50 may be present overlying the channel 40 of the semiconducting body 10. The semiconductor device 100 may further include a drain contact 60 to the drain dopant region 30 of the semiconducting body 10, the drain contact 60 being composed of a conductive material and in direct physical contact with a portion of a sidewall S1 of the semiconducting body 10 having a dimension that is less than a thickness T1 of the semiconducting body 10, in which the drain dopant region 30 is positioned.

The schottky barrier region 20 may be a metal-semiconductor junction that has rectifying characteristics, similar to those of a diode formed by a p-n junction, i.e., an intrinsic semiconductor having a first region doped with a p-type dopant abutting a second region doped with an n-type dopant. Differences between a schottky barrier region 20 and a typical p-n junction are the lower junction voltage of the schottky barrier region 20, and decreased (almost nonexistent) depletion width in the metal of the schottky barrier region 20. It is noted that not all metal-semiconductor junctions can provide a schottky barrier region 20 in accordance with the present invention. A metal-semiconductor junction that does not rectify current is called an ohmic contact. Rectifying properties that characterize the metal-semiconductor junction as a schottky barrier region 20 depend upon the metal's work function, the band gap of the intrinsic semiconductor, and the type and concentration of dopants in the semiconductor. For example, Ni having a work function of approximately 4.5 V when in direct physical contact to silicon that has been doped to a concentration ranging from about $10^{17}$ cm$^{-3}$ to about $10^{19}$ cm$^{-1}$ with n-type or p-type dopants forms a Schottky barrier 20 having barrier height of approximately 0.45V.

The metal semiconductor junction, i.e., metal semiconductor alloy, that provides the schottky barrier region 20 may include, but is no limited to, NiSi$_2$, TiSi$_2$, CoSi$_2$, MoSi$_2$, PtSi$_2$, TaSi$_2$, WSi or a combination thereof. In one embodiment, the schottky barrier region 20 extends to a depth D$_1$ that is substantially equal to the thickness T$_1$ of the semiconducting body 10.

The drain contact 60 may be composed of a conductive material, such as doped polysilicon. In one embodiment, the drain contact 60 is composed of polysilicon that is doped with at least one of Arsenic, Phosphorus, Antimony, wherein the dopant is present in a concentration ranging from about $10^{19}$ cm$^{-3}$ to about $10^{21}$ cm$^{-3}$. In another embodiment, the drain contact 60 is composed of polysilicon that is doped with at least one of Boron or Indium, wherein the dopant is present in a concentration ranging from about $10^{19}$ cm$^{-3}$ to about $10^{21}$ cm$^{-3}$.

In one embodiment, the direct physical contact 61 of the drain contact 60 to the drain dopant region 30 has a length ranging from about 5 nm to about 40 nm. In another embodiment, the direct physical contact 61 of the drain contact 60 to the drain dopant region 30 has a length ranging from about 10 nm to about 30 nm. In a further embodiment, the direct physical contact 61 of the drain contact 60 to the drain dopant region 30 has a length ranging from about 15 nm to about 20 nm.

A remaining portion 62 of the sidewall S$_1$ of the semiconducting body 10, i.e., the portion of the sidewall S1 of the semiconducting body 10 that is not in direct physical contact with the drain contact 60, may be in direct physical contact with a dielectric material 70. The dielectric material 70 may be provided by an oxide, nitride, or oxynitride. In one embodiment, the dielectric material 70 is an oxide, such as silicon oxide.

The gate structure 50 may include a gate dielectric 51 atop the semiconducting body 10, a gate conductor 52 atop the gate dielectric 51, and spacers abutting the sidewalls of the gate conductor 52 and the gate dielectric 51.

The various components of the structure shown in FIG. 1, as well as a process that can be used in forming the same will now be described in greater detail referring to FIGS. 2-12.

FIGS. 1-12 depict a method for forming a semiconductor device 100, in accordance with the present invention. In one embodiment, the method of forming a semiconductor device 100 may begin with providing a substrate 5 including a semiconducting layer 6 overlying an insulating layer 4 and forming gate structures 50 atop the semiconducting layer 6. In a following step, portions of the semiconducting layer 6 are removed to provide exposed portions 4a of the insulating layer 4, wherein a remaining portion of the semiconducting layer 6 provides a semiconducting body 10 underlying the gate structure 50. Thereafter, dielectric regions 12 may be formed on the exposed portions 4a of the insulating layer 4, wherein the dielectric regions 12 abut the semiconducting body 10. A portion of the dielectric regions 12 may then be removed, wherein a remaining portion 12a of the dielectric region 12 is in direct physical contact with a drain dopant region 30 of the semiconducting body 10. In one embodiment, the method further includes forming a schottky barrier region 20 on the portion of the semiconducting body 10 that is opposite the drain dopant region 30, and forming a drain contact 60 to the drain dopant region 30, wherein the drain contact 60 to the drain dopant region 30 is present overlying the remaining portion 12a of the dielectric region 12 and is in direct physical contact with the drain dopant region 30 of the semiconducting body 10.

Figure 2:
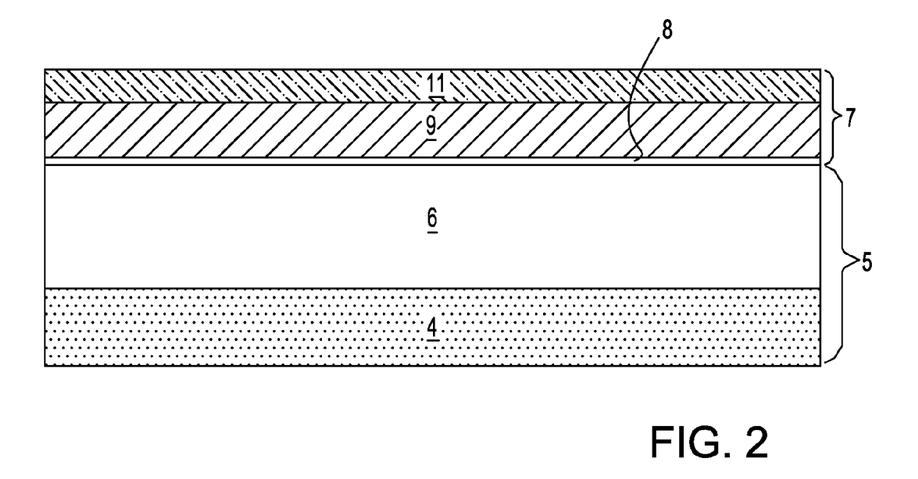
FIG. 2 is a side cross-sectional view of an initial structure including a pad dielectric stack atop a semiconductor-on-insulator substrate, as used in accordance with the present invention.

FIG. 2 depicts one embodiment of an initial structure that may be used in the inventive method that includes a substrate 5 composed of an insulating layer 4 and a semiconducting layer 6 atop the insulating layer 4, and a gate material stack 7 atop the substrate 5. The gate material stack 7 includes a gate dielectric layer 8 present atop the semiconducting layer 6 of the substrate 5, a gate conductor layer 9 present atop the gate dielectric layer 8, and a dielectric cap layer 11 atop the gate conductor layer 9.

In one embodiment, the substrate 5 includes an SOI substrate. An SOI substrate includes a bottom semiconductor layer (not shown) and a top semiconducting layer 6 (i.e., active semiconductor layer, which is also referred to as an SOI layer 6) that are electrically isolated from each other by an insulating layer 4, which may be referred to as a buried insulator layer 4. The top semiconductor layer 6 and bottom semiconductor layers may comprise one of Si, Ge alloys, SiGe, GaAs, InAs, InP, SiCGe, SiC as well as other III/V or II/VI compound semiconductors.

In one embodiment, the insulating layer 4 separating the two semiconducting layers may be a crystalline or non-crystalline oxide or nitride. In one embodiment, the SOI substrate employed in the present invention may be formed utilizing conventional processing techniques well known in the art. For example, a layer transfer process including a bonding step can be used in providing the SOI substrate. Alternatively, an implantation process such as SIMOX (Separation by IMplantation of OXygen) can be used in forming the SOI substrate. In one embodiment, the top semiconducting layer 6 has a thickness from about 3 to about 100 nm, and the insulating layer 4 has a thickness ranging from about 10 to about 150 nm.

It is noted that although an SOI substrate is depicted and described in the following discussion, embodiments of the present invention are also contemplated that utilize a bulk semiconductor substrate. In another embodiment of the present invention, in which a bulk semiconductor substrate is used, the bulk semiconductor substrate comprises one of Si, Ge alloys, SiGe, GaAs, InAs, InP, SiCGe, SiC as well as other III/V or II/VI compound semiconductors.

Still referring to FIG. 2, the gate material stack 7 is then formed on the semiconducting layer 6. The gate dielectric layer 8 may be a low-k dielectric material (having a dielectric constant equal to or less than 4.0) such as $SiO_2$, or a high-k dielectric (having a dielectric constant greater than about 4.0), such as oxides of Ta, Zr, Al or combinations thereof. Hf containing high-k dielectrics have also be contemplated and are within the scope of the present invention. In one embodiment, the gate dielectric layer 8 has a thickness from about 1 nm to about 10 nm. In another embodiment, the gate dielectric layer 8 has a thickness from about 1.5 to about 2.5 nm. In one embodiment, the gate dielectric layer 8 is formed using a deposition method, such as chemical vapor deposition. In another embodiment, the gate dielectric layer 8 is formed using a thermal growth method, such as thermal oxidation.

In one embodiment, the gate conductor layer 9 is composed of polysilicon. In another embodiment, the gate conductor layer 9 is comprised of a conductor selected from the group including, but not limited to: elemental metals, metal alloys, or metal silicides. Combinations and multilayers of any of the conductors mentioned previously are also contemplated. The gate conductor layer 9 may be formed using chemical vapor deposition, such as plasma enhanced chemical vapor deposition, or physical vapor deposition, such as plating or sputtering. In one embodiment, the gate conductor layer 9 has a thickness ranging from about 10 nm to about 100 nm.

In one embodiment, the dielectric cap layer 11 is composed of an oxide, a nitride or an oxynitride. In one embodiment, the dielectric cap layer 11 is composed of a nitride, such as silicon nitride. The dielectric cap layer 11 may be formed using chemical vapor deposition, such as plasma enhanced chemical vapor deposition, or thermal growth. In one embodiment, the dielectric cap layer 11 has a thickness from about 10 nm to about 100 nm. It is noted that embodiments of the present invention have been contemplated in which the dielectric cap layer 11 may be omitted.

Figure 3:
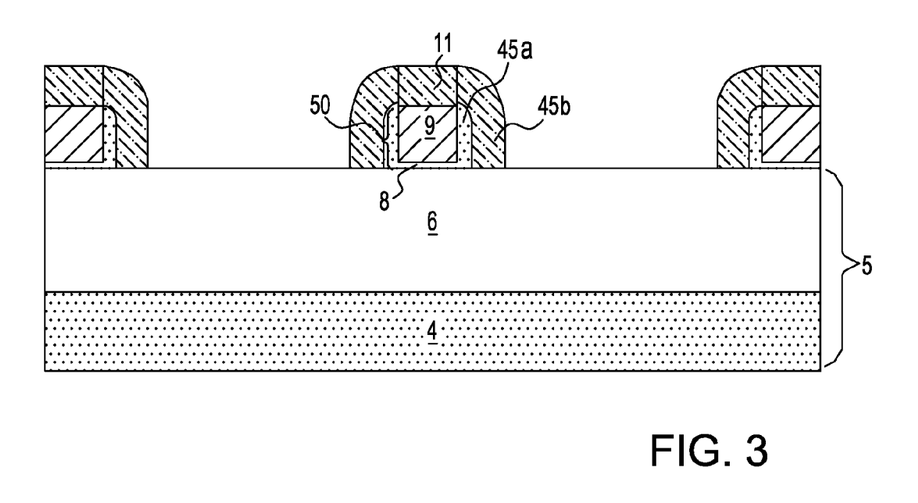
FIG. 3 is a side cross-sectional view depicting forming a gate structure atop the semiconducting layer of the silicon-on-insulator substrate, as used in accordance with the present invention.

FIG. 3 is a side cross-sectional view depicting forming a gate structure 50 from the gate material stack 7 that is present atop the semiconducting layer 6 of the substrate 5. In one embodiment, the gate structure 50 is formed utilizing photolithography and etch processing steps. For example, a pattern can be produced by applying a photoresist to the surface to be etched, exposing the photoresist to a pattern of radiation, and then developing the pattern into the photoresist utilizing conventional resist developer. Once the patterning of the photoresist is completed, the sections covered by the photoresist are protected while the exposed regions are removed using a selective etching process that removes the unprotected regions.

In a following process step of the present method, dielectric spacers 45a, 45b, may be formed adjacent the sidewalls of the gate structure 50. The dielectric spacer 45a, 45b may be composed of an oxide, nitride or oxynitride material. In one embodiment, a first dielectric spacer 45a, such as an oxide spacer, is formed in direct contact with the sidewalls of the gate conductor 9, and a second dielectric spacer 45b, such as a silicon nitride spacer, is formed abutting the first dielectric spacer 45a. In one embodiment, in which the first dielectric spacer 45a is composed of an oxide, the first dielectric spacer 45a may be formed using a conformal deposition process, and may have a thickness ranging from about 1 nm to about 5 nm. The second dielectric spacer 45b may be a dielectric material, such as an nitride, oxynitride, or a combination thereof. In one embodiment, the second dielectric spacers 45b may be formed using deposition and etch processes, and may have a width ranging from about 2 nm to about 30 nm.

Figure 4:
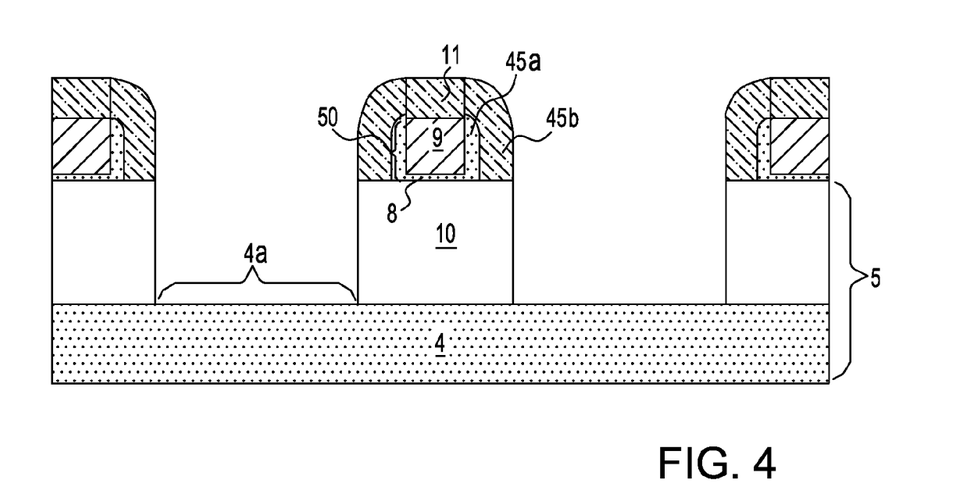
FIG. 4 is a side cross-sectional view depicting one embodiment of removing portions of the semiconducting layer to provide exposed portions of the insulating layer, wherein a remaining portion of the semiconducting layer provides a semiconducting body underlying the gate structure, as used in accordance with the present invention.

FIG. 4 depicts one embodiment of removing portions of the semiconducting layer 6 to provide exposed portions 4a of the insulating layer 4, wherein a remaining portion of the semiconducting layer 6 provides a semiconducting body 10 underlying the gate structure 50. The step of removing portions of the semiconducting layer 6 to expose the portions 4a of the insulating layer 4 that abut the portion of the insulating layer 4 underlying the gate structures 50 may include a selective etch step.

In one embodiment, the step of removing portions of the semiconducting layer 6 to provide exposed portions 4a of the insulating layer 4 includes an anisotropic etch step selective to the second dielectric spacers 45b. As used herein, the term "selective" in reference to a material removal process denotes that the rate of material removal for a first material is greater than the rate of removal for at least another material of the structure to which the material removal process is being applied. In one embodiment, in which the cap dielectric layer 11 is present, the anisotropic etch step removes the semiconducting layer 6 selective to the second dielectric spacers 45b and the cap dielectric layer 11. In one embodiment, in which the semiconducting layer 6 is composed of Si, the dielectric spacers 45b are composed of silicon nitride, and the cap dielectric layer 11 is composed of silicon nitride, the etch chemistry may be an HF etch chemistry. In one embodiment, the anisotropic etch step includes reactive ion etch (RIE). Reactive ion etching is a form of plasma etching, in which during etching the surface to be etched is placed on an RF powered electrode, wherein the surface to be etched takes on a potential that accelerates the etching species that is extracted from a plasma towards the surface to be etched, in which a chemical etching reaction is taking place in the direction normal to the surface.

Figure 5:
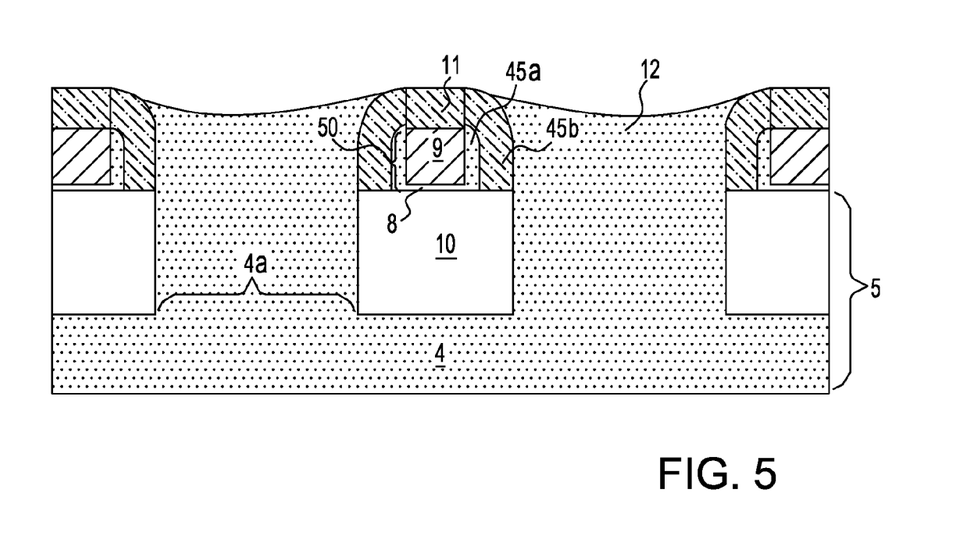
FIGS. 5 and 6 are side cross-sectional views depicting one embodiment of a process sequence for forming dielectric regions on the exposed portions of the insulating layer, wherein the dielectric regions abut the semiconducting body, in accordance with the present invention.
Figure 6:
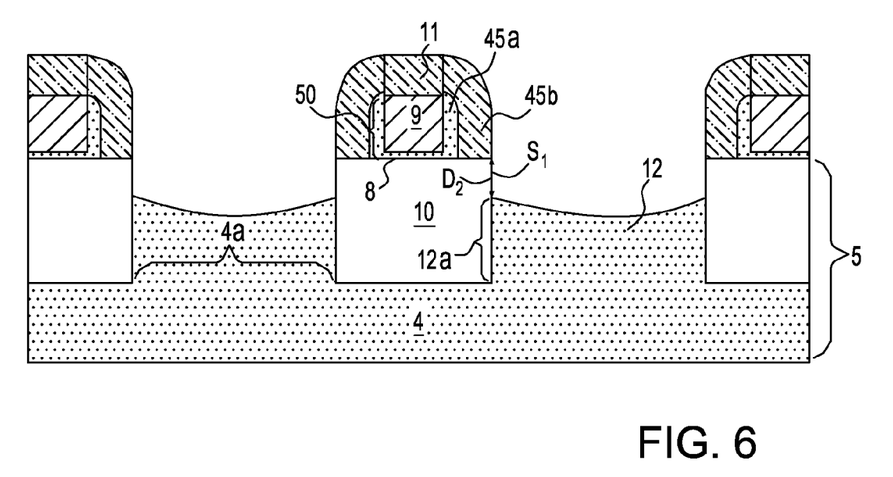

FIG. 5 depicts one embodiment of forming dielectric regions 12 on the exposed portions of the insulating layer 4, wherein the dielectric regions 12 abut the semiconducting body 10. The dielectric regions 12 may be composed of an oxide, nitride, or oxynitride material. In one embodiment, in which the dielectric regions 12 are composed of an oxide material, such as silicon oxide, the dielectric regions 12 are formed on the exposed portions 4a of the insulating layer 4 using a thermal growth process, such as thermal oxidation. In another embodiment, the dielectric regions 12 are formed on the exposed portions of the insulating layer 4 using a deposition process, such as chemical vapor deposition (CVD). Following deposition of the dielectric regions 12, a planarization process, such as chemical mechanical planarization (CMP), may be employed to provide dielectric regions 12 having an upper surface substantially coplanar with the upper surface of the gate structures 50, as depicted in FIG. 6. Planarization is a material removal process that employs at least mechanical forces, such as frictional media, to produce a planar surface. Chemical Mechanical Planarization is a material removal process using both chemical reactions and mechanical forces to remove material and planarize a surface.

FIGS. 6, 7, 8a and 8b depict one embodiment of a process sequence for forming a conductive material 13 atop the dielectric material of the dielectric regions 12 that abut the semiconducting body 10. Following planarization of the dielectric material, the dielectric region 12 may be recessed to expose the sidewall S1 of the drain dopant region 30 of the semiconducting body 10 so that the subsequently formed drain contact 60 is formed in direct physical contact with the drain dopant region 30 of the semiconducting body 10. In one embodiment, the length of the portion $D_2$ of the sidewall $S_1$ that is exposed following the etch step that recesses the dielectric region 12 ranges from about 10 nm to about 30 nm. In another embodiment, the length of the portion $D_2$ of the sidewall $S_1$ that is exposed following the etch step that recesses the dielectric region 12 is on the order of about 20 nm. In one embodiment, the dielectric region 12 are recessed by an anisotropic etch process, such as reactive ion etch. Following the etch process that recesses the dielectric region 12, a remaining portion 12a of the dielectric region 12 may remain in direct physical contact with a drain dopant region 30 of the semiconducting body 10, as depicted in FIG. 6.

Figure 7:
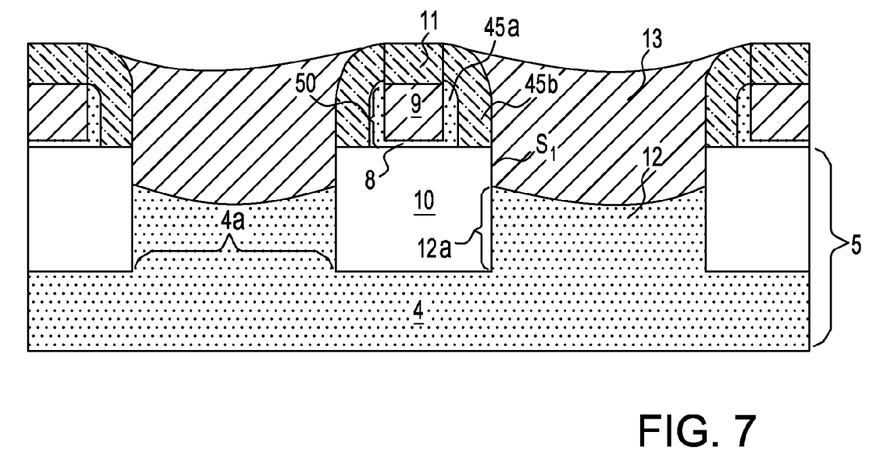
FIGS. 7 and 8a are side cross-sectional views depicting one embodiment of forming a first conductive material atop the dielectric material of the dielectric regions that abut the semiconducting body, in accordance with the present invention.

Referring to FIG. 7, following the step of recessing the dielectric region 12, a first conductive material 13 may be formed atop the remaining portion 12a of the dielectric region 12, in which a portion of the first conductive material 13 is in direct physical contact with the sidewall S1 of the drain dopant region 30 of the semiconducting body 10. The first conductive material 13 may be composed of a doped polysilicon. In one embodiment, the polysilicon of the first conductive material 13 may be doped with an impurity selected from the group including, but not limited to Arsenic, Phosphorus, Antimony. In one embodiment, the impurity content of the polysilicon that provides the first conductive material 13 may range from about $10^{19}$ cm$^{-3}$ to about $10^{21}$ cm$^{-3}$.

The first conductive material 13 may be formed using epitaxial growth, wherein the dopant is incorporated in-situ. In another embodiment, the first conductive material 13 may be deposited using chemical vapor deposition. Although the above description of the first conductive material 13 is specific to polysilicon, it is noted that other conductive materials are also contemplated for the first conductive material 13 including, but not limited to: Arsenic, Phosphorus, and Antimony.

Figure 8A:
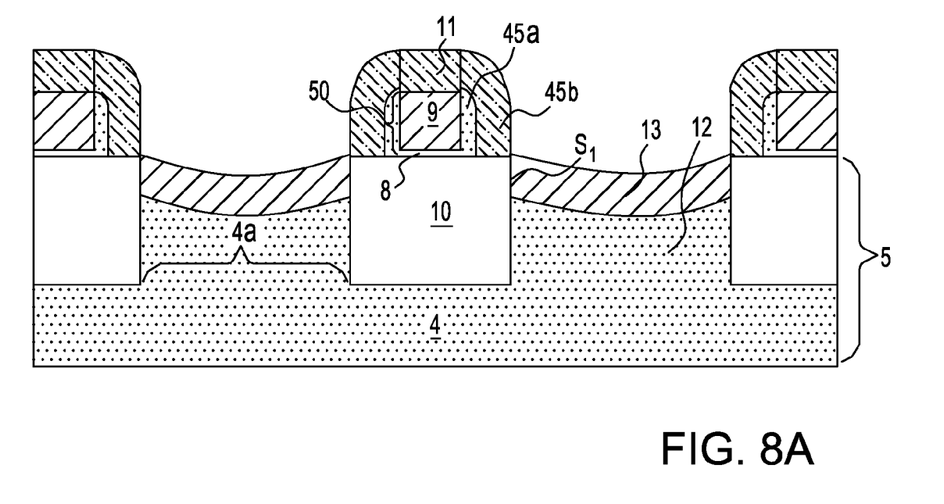
Figure 8B:
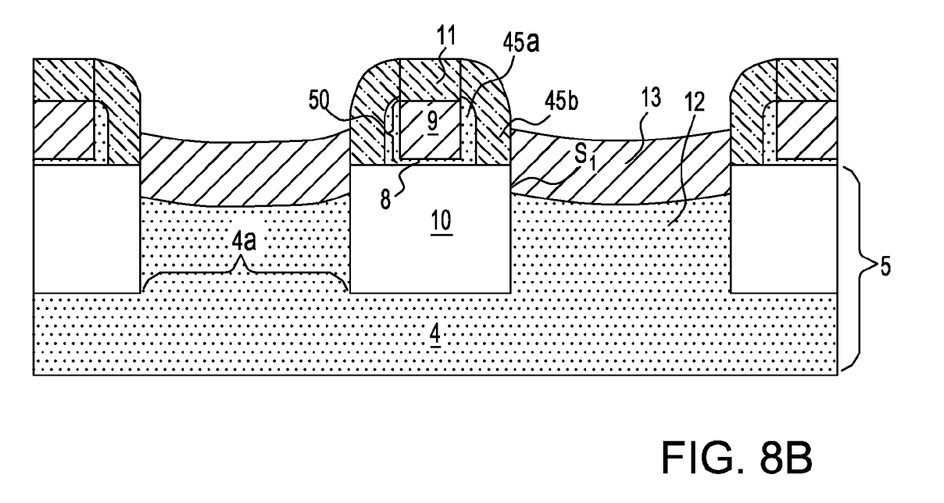
FIG. 8b is a side cross-sectional view of another embodiment of a forming a first conductive material atop the dielectric material, in accordance with the present invention.

In one embodiment, the first conductive material 13 may be grown to a thickness ranging from about 40 nm to about 200 nm. Following deposition, the thickness of the first conductive material 13 may be thinned with an etch process, such as a reactive ion etch. Following the deposition and optional etch processes, the upper surface of the first conductive material 13 may be substantially coplanar with, or lower than, the upper surface of the semiconductor body 10, as depicted in FIG. 8a. In another embodiment and following the deposition and optional etch processes, the upper surface of the first conductive material 13 may be higher than the upper surface of the upper surface of the semiconductor body 10, as depicted in FIG. 8b.

FIGS. 9a, 9b and 10a, 10b are side cross-sectional views depicting some embodiments of removing a portion of the first conductive material 13 and a portion of the dielectric material 12a that is underlying the first conductive material 13, wherein a remaining portion of the first conductive material 13a is in direct physical contact with a drain dopant region 30 of the semiconducting body 10.

Figure 9A:
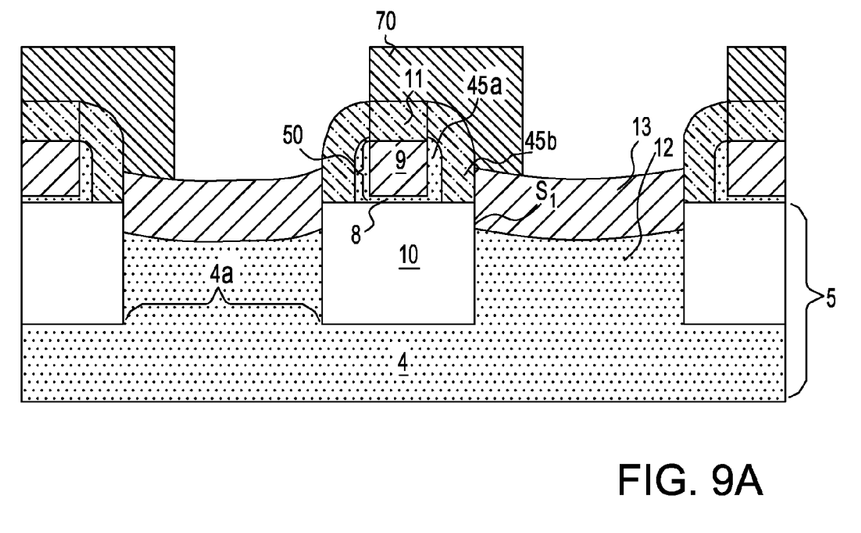
FIGS. 9a and 10a are side cross-sectional views depicting the embodiments of the present invention that utilize an etch sequence that includes the steps of forming an etch mask composed of photoresist material overlying the gate structure and the portion of the first conductive material that is in direct physical contact with the drain dopant region of the semiconducting body. In a following process step, the portions of the first conductive material and the underlying dielectric material that are not protected by the etch mask are removed with an anisotropic etch process, in accordance with the present invention.
Figure 10A:
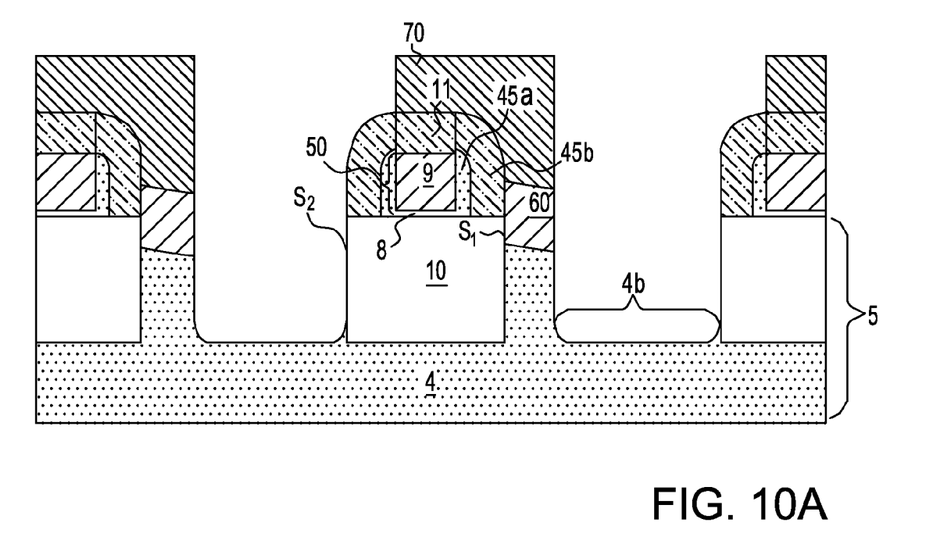

FIGS. 9a and 10a depict the embodiments of the present invention that utilize an etch sequence that includes the steps of forming an etch mask composed of photoresist material 70 overlying the gate structure 50 and the portion of the first conductive material 13 that is in direct physical contact with the drain dopant region 30 of the semiconducting body 10, and removing the portions of the first conductive material 13 and the underlying dielectric material 12 that are not protected by the etch mask 70 with an anisotropic etch process.

Referring to FIG. 9a, the step of forming the etch mask composed of photoresist material 70 may include depositing a layer of photoresist atop the first conductive material, wherein the layer of photoresist material can be applied via spin coating or similar processes. In one embodiment, the photoresist material is composed of dielectrics including carbon, oxygen, and inorganic materials. Following application of the photoresist layer, the photoresist may be soft-baked, where the solvents of the photoresist layer can be evaporated via heating. The layer of photoresist is then patterned using a photolithography.

The patterned photoresist etch mask 70 may be formed utilizing photolithography and etching process steps. Specifically, in one embodiment, a pattern is formed using a reticle or photomask and transferred into the surface of the layer of the photoresist that is present on overlying the first conductive layer 13. First, the pattern on the reticle or photomask is transferred onto a layer of photoresist on the surface to be etched, or alternatively implanted. Light is passed through the opaque pattern of the reticle, which in turn produces a patterned image on the layer of photoresist. The photoresist layer is a light or radiation sensitive material and exposure to light causes changes in the photoresist structure. For example, exposure to light may change the exposed portions of the photoresist from a soluble condition to an insoluble one.

Following exposure the pattern is developed utilizing conventional resist developer, such as a chemical solvent. The developer leaves a hole in the resist layer that corresponds to the opaque pattern of the reticle. An alternative resist strategy, commonly referred to as a negative resist, leaves a pattern in the resist opposite to that on the mask. Development of the pattern is conducted using conventional development techniques including, but not limited to: continuous spray development and puddle development. Following development, the remaining portion of the photoresist layer is present overlying the gate structure 50, and a portion of the first conductive layer 13 that remains following the subsequent etch step to provide the drain contact 60.

Referring to FIG. 10*a*, in a following process step, the patterned photoresist 70 is used as an etch mask, wherein the exposed portions of the first conductive layer 13 and the underlying portions of the dielectric material of the dielectric region 12 are removed using an anisotropic etch process. In one embodiment, the anisotropic etch process includes a reactive ion etch (RIE). In one embodiment, the etch process removes the exposed portion of the first conductive layer 13 and the underling dielectric material of the dielectric region 12 to expose a portion 4*b* of the insulating layer 4.

The etch process may include a selective etch chemistry that removes the first conductive layer 13 and the dielectric material of the dielectric region 12 selective to the dielectric spacers 45*b*, the dielectric cap layer 11, and the photoresist etch mask 70. In one embodiment, in which the first conductive layer 13 is composed of polysilicon, the dielectric material of the dielectric region 12 is composed of an oxide, and the dielectric cap layer 11 and the dielectric spacers 45*b* are composed of a nitride, the etching step may be carried out utilizing an etch gas chemistry that includes, for example, fluorine-based gases, including $CF_4$, $CF_4/O_2$, $SF_6$, and $C_2F_6/O_2$, but also may include plasma etch gasses that contain both chlorine and fluorine. In one embodiment, the etch process is continued to expose the entire sidewall $S_2$ of the portion of the semiconducting body 10, in which the schottky barrier region 20 will be subsequently formed.

Figure 9B:
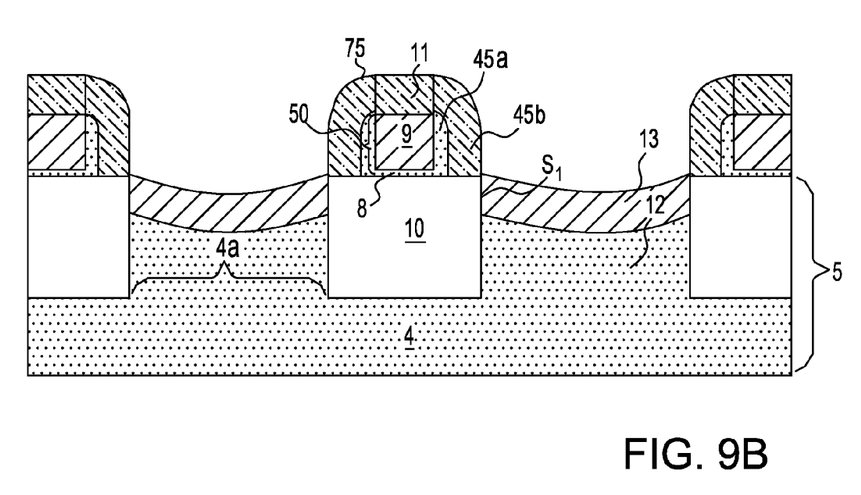
FIGS. 9b and 10b are side cross-sectional views depicting the embodiments of the present invention that utilize an etch sequence that includes the steps of forming an etch mask composed of a hard mask material overlying the gate structure and the portion of the first conductive material that is in direct physical contact with the drain dopant region of the semiconducting body. In a following process step, the portions of the first conductive material and the underlying dielectric material that are not protected by the etch mask are removed with an anisotropic etch process, in accordance with the present invention.
Figure 10B:
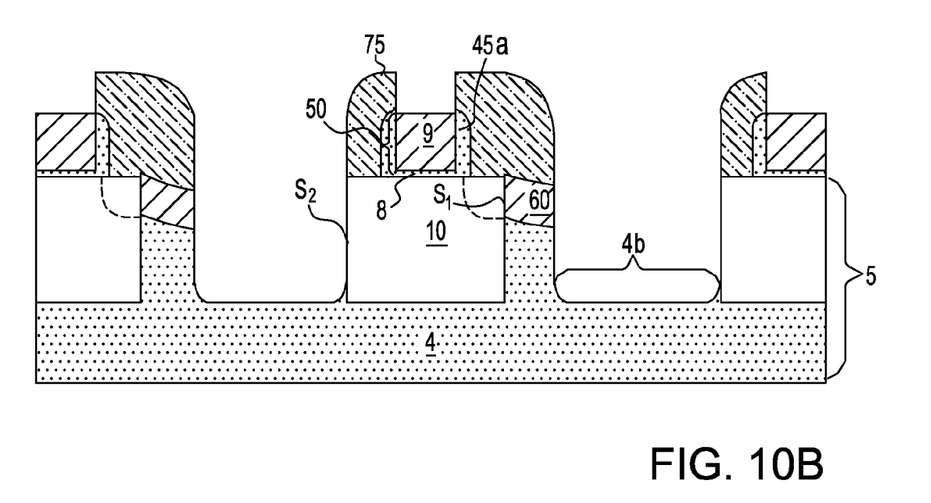

FIGS. 9*b* and 10*b* are side cross-sectional views depicting the embodiments of the present invention that utilize an etch sequence including the steps of forming an etch mask composed of a hard mask material 75 overlying the gate structure 50 and the portion of the first conductive material 13 that is in direct physical contact with the drain dopant region 30 of the semiconducting body 10, and removing the portions of the first conductive material 13 and the underlying dielectric material of the dielectric regions 12 that are not protected by the etch mask 75 with an anisotropic etch process. In the embodiments represented by FIGS. 9*b* and 10, the dielectric spacers 45*b* that are described above with reference to FIGS. 1-8 may be omitted.

The etch mask composed of a hard mask material 75 may be provided by depositing a dielectric layer, followed by patterning the dielectric layer using a photoresist mask and a selective etch process. The dielectric layer may be composed of an oxide, a nitride or an oxynitride. In one embodiment, the dielectric layer is composed of silicon nitride. The dielectric layer may be formed using chemical vapor deposition, such as plasma enhanced chemical vapor deposition, or thermal growth. In one embodiment, the dielectric layer has a thickness ranging from about 10 nm to about 100 nm. In another embodiment, the dielectric layer has a thickness ranging from about 30 nm to about 60 nm.

The photoresist mask may be formed utilizing photolithography and development process steps. Specifically, in one embodiment, a pattern is produced by applying a photoresist layer to the dielectric layer that is going to be etched to provide the hard mask 70; exposing the photoresist layer to a pattern of radiation; and then developing the pattern into the photoresist layer utilizing resist developer. Once the patterning of the photoresist layer is completed, the sections covered by the photoresist layer are protected while the exposed regions are removed using a selective etching process that removes the unprotected regions to provide the hard mask 70.

The etch step to remove the portions of the dielectric layer that are exposed by the photoresist mask may be a selective etch step that removes the exposed portion of the dielectric layer selective to the photoresist mask and the first conductive material 13. In one embodiment, in which the dielectric layer is composed of silicon nitride, the etch chemistry of the selective etch process may include HF. In one embodiment, the etch process is an anisotropic etch process, such as reactive ion etch (RIE). In a following process, the photoresist mask is removed using a stripping process, such as oxygen ashing.

Following the formation of the hard mask 70, the exposed portions of the first conductive layer 13 and the underlying portions of the dielectric material of the dielectric region 12 are removed using an anisotropic etch process. In one embodiment, the anisotropic etch process includes a reactive ion etch (RIE). In one embodiment, the etch process removes the exposed portion of the first conductive layer 13 and the underling dielectric material of the dielectric region 12 to expose a portion 4*b* of the insulating layer 4.

The etch process may include a selective etch chemistry that removes the first conductive layer 13 and the dielectric material of the dielectric region 12 selective to the dielectric spacers 45*b*, the dielectric cap layer 11, and the photoresist etch mask 70. In one embodiment, in which the first conductive layer 13 is composed of polysilicon, the dielectric material of the dielectric region 12 is composed of an oxide, and the dielectric cap layer 11 and the dielectric spacers 45*a* are composed of a nitride, the etching step may be carried out utilizing an etch gas chemistry that includes, for example, fluorine-based gases, including $CF_4$, $CF_4/O_2$, $SF_6$, and $C_2F_6/O_2$, but also may include plasma etch gasses that contain both chlorine and fluorine. The etch process may be continued to expose the entire sidewall $S_2$ of the portion of the semiconducting body 10, in which the schottky barrier region 20 will be subsequently formed.

When present the dielectric cap layer 11 may be removed at this point of the process sequence to expose the upper surface of the gate conductor 9. In one embodiment, the dielectric cap layer 11 is removed using reactive ion etch (RIE).

Figure 11:
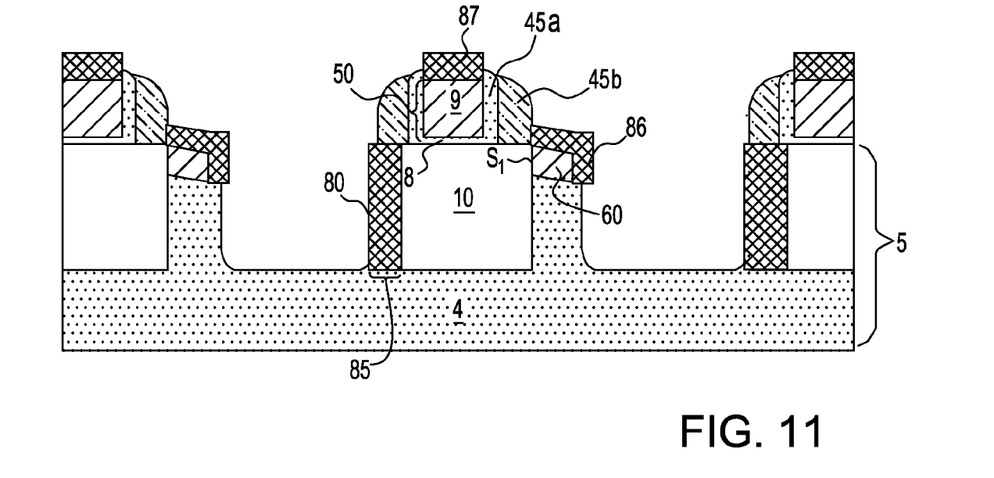
FIGS. 11 and 12 are side cross-sectional views depicting forming a silicide on the portion of the semiconducting body that is opposite the drain dopant region, and forming a silicide on the remaining portion of the conductive material that is in direct physical contact with a drain dopant region of the semiconducting body, in accordance with one embodiment of the present invention.

FIG. 11 depicts one embodiment of forming a silicide 80 on the portion 85 of the semiconducting body 10 that is opposite the drain dopant region 30, and forming a silicide 86 on the remaining portion of the conductive material 13 that is in direct physical contact with a drain dopant region 30 of the semiconducting body 10. In one embodiment, a silicide 87 is also formed atop the exposed upper surface of the gate conductor 9. Silicide formation may include depositing a metal layer, such as a refractory metal, onto the surface of a Si-containing material. The metal layer may be deposited using physical vapor deposition (PVD), such as plating or sputtering or may be deposited using chemical vapor deposition (CVD). In one embodiment, the metal layer may be composed of Ni, Ti, Co, Mo, Pt, Ta, W or a combination thereof. Following deposition, the structure is then subjected to an annealing step using conventional processes such as, but not limited to, rapid thermal annealing. During thermal annealing, the deposited metal reacts with Si forming a metal semiconductor alloy, which is also referred to as a metal silicide.

In one embodiment. the silicide 80 that is formed on the portion 85 of the semiconducting body 10 that is opposite the drain dopant region 30 provides the schottky barrier regions 20 of the device. In one embodiment, the silicide of the schottky barrier regions 20, the silicide 86 on the remaining portion of the conductive material 13 that is in direct physical contact with a drain dopant region 30 of the semiconducting body 10, and the silicide 87 on the upper surface of the gate conductor 9 may be composed $NiSi_2$, $TiSi_2$, $CoSi_2$, $MoSi_2$, $PtSi_2$, $TaSi_2$, $WSi$ or a combination thereof.

Figure 12:
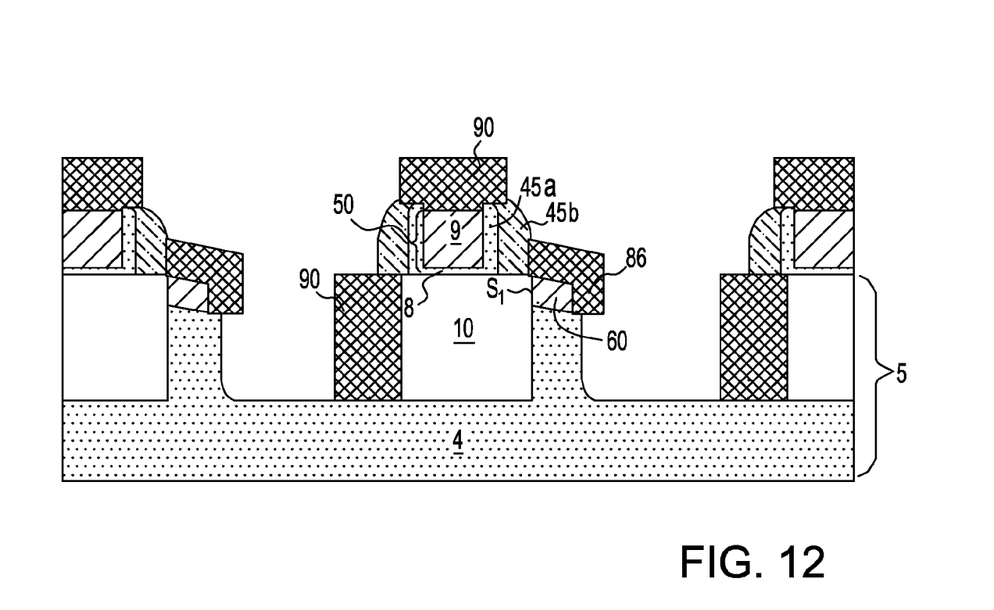

FIG. 12 depicts one embodiment of epitaxially growing a NiSi region 90 atop the silicide 80 that is present on the portion 85 of the semiconducting body 10 that is opposite the drain dopant region 30, the silicide 86 that is present on the remaining portion of the conductive material 13 that is in direct physical contact with a drain dopant region 30 of the semiconducting body 10, and the silicide 87 that is present atop the gate conductor 9. In one embodiment, the NiSi region 90 is grown to a thickness ranging from about 5 nm to about 50 nm. In another embodiment, the NiSi region 90 is grown to a thickness ranging from about 10 nm to about 20 nm. It is noted that other materials have been contemplated for the NiSi region 90, such as metal semiconductor alloys, in which the metal component includes, but is not limited to: Pt, Et, Co, or combinations thereof.

At this point, in some embodiments of the invention, BEOL (back-end-of-the-line) processes may be performed, resulting in the final structure depicted in FIG. 1. For example, a layer of insulating material 110 such as BPSG (boron doped phosphorus silicate glass) 110 can be formed over the structure by deposition and planarization. Contact openings can be formed into the insulating material 110 by lithography and etching and thereafter the contact holes can be filled with a conductive material 120, such as, for example, Cu, Al, W, polysilicon and other like conductive materials.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
   providing a substrate including a semiconducting layer overlying an insulating layer;
   forming a gate structure atop a channel region of the semiconducting layer;
   removing portions of the semiconducting layer to provide exposed portions of the insulating layer, wherein a remaining portion of the semiconducting layer provides a semiconducting body underlying the gate structure that includes the channel region;
   forming dielectric regions on the exposed portions of the insulating layer, wherein the dielectric regions abut the semiconducting body;
   removing a portion of the dielectric regions, wherein a remaining portion of the dielectric region remains in direct physical contact with a drain dopant region of the semiconducting body, the drain dopant region being in direct physical contact with a first end of the channel region;
   forming a schottky barrier region as a source region on the portion of the semiconducting body that is opposite the drain dopant region, said schottky barrier region is in direct physical contact with a second end of the channel region; and
   forming a drain contact to the drain dopant region, wherein the drain contact to the drain dopant region is present overlying the remaining portion of the dielectric region and is in direct physical contact with a sidewall of the drain dopant region of the semiconducting body.

2. The method of claim 1 wherein the providing of the substrate including the semiconducting layer overlying the insulating layer comprises a silicon on insulator substrate.

3. The method of claim 1 wherein the forming of the gate structure includes forming a gate dielectric layer atop the semiconducting layer; forming a gate conductor layer atop the gate dielectric layer; patterning the gate conductor layer and the gate dielectric layer to provide a gate stack; and forming spacers abutting the gate stack.

4. The method of claim 3, wherein the step of removing portions of the semiconducting layer to provide exposed portions of the insulating layer comprises an anisotropic etch step selective to the spacers and the insulating layer.

5. The method of claim 1 wherein the forming of the dielectric regions on the exposed portions of the insulating layer comprises thermal growth of a dielectric material top the exposed portion of the insulating layer, and planarization of the dielectric material to provide a dielectric material having an upper surface being substantially coplanar with an upper surface of the gate structure.

6. The method of claim 1 wherein the forming of the schottky barrier region on the portion of the semiconducting body that is opposite the drain dopant region comprises:
   forming an etch mask overlying at least the gate structure;
   removing the dielectric material to expose a sidewall of the semiconducting body opposite the drain dopant region; and
   forming a metal semiconductor alloy of the sidewall of the semiconducting body opposite the drain dopant region.

7. The method of claim 6, wherein the forming the metal semiconductor alloy comprises depositing a metal on the sidewall of the semiconducting body that is opposing the drain dopant region, wherein the metal is comprised of Ni, Ti, Co, Mo, Pt, Ta, W or a combination thereof.

8. The method of claim 5, wherein following the planarization of the dielectric material, the dielectric material is recessed to expose the sidewall of the drain dopant region of the semiconducting body that the drain contact is formed in direct physical contact with the drain dopant region of the semiconducting body.

9. The method of claim 8, wherein following recessing of the dielectric material a first conductive material is deposited, in which a portion of the first conductive material is in direct physical contact with the sidewall of the drain dopant region of the semiconducting body.

10. The method of claim 9, wherein the forming of the drain contact to the drain dopant region comprises forming an etch mask overlying the gate structure and the portion of the conductive material that is in direct physical contact with the drain dopant region of the semiconducting body; removing portions of the first conductive material and the underlying dielectric material that are not protected by the etch mask with an anisotropic etch process; and
   depositing a second conductive material.

11. A method of forming a semiconductor device comprising:
   providing a substrate including a semiconducting layer overlying an insulating layer;
   forming a gate structure atop the semiconducting layer;
   removing portions of the semiconducting layer to provide exposed portions of the insulating layer, wherein a remaining portion of the semiconducting layer provides a semiconducting body underlying the gate structure;
   thermally growing dielectric material atop the exposed portion of the insulating layer;
   planarizing the dielectric material to provide a dielectric material having an upper surface that is substantially coplanar with an upper surface of the gate structure to form dielectric regions on the exposed portions of the insulating layer, wherein the dielectric regions abut the semiconducting body;

removing a portion of the dielectric regions, wherein a remaining portion of the dielectric region remains in direct physical contact with a drain dopant region of the semiconducting body;

forming a schottky barrier region on the portion of the semiconducting body that is opposite the drain dopant region; and forming a drain contact to the drain dopant region, wherein the drain contact to the drain dopant region is present overlying the remaining portion of the dielectric region and is in direct physical contact with the drain dopant region of the semiconducting body.

12. The method of claim 11 wherein the forming of the schottky barrier region on the portion of the semiconducting body that is opposite the drain dopant region comprises:

forming an etch mask overlying at least the gate structure;

removing the dielectric material to expose a sidewall of the semiconducting body opposite the drain dopant region; and forming a metal semiconductor alloy of the sidewall of the semiconducting body opposite the drain dopant region.

13. The method of claim 12, wherein the forming the metal semiconductor alloy comprises depositing a metal on the sidewall of the semiconducting body that is opposing the drain dopant region, wherein the metal is comprised of Ni, Ti, Co, Mo, Pt, Ta, W or a combination thereof 14. The method of claim 11, wherein following the planarizing of the dielectric material, the dielectric material is recessed to expose the sidewall of the drain dopant region of the semiconducting body that the drain contact is formed in direct physical contact with the drain dopant region of the semiconducting body.

15. The method of claim 14, wherein following recessing of the dielectric material a first conductive material is deposited, in which a portion of the first conductive material is in direct physical contact with the sidewall of the drain dopant region of the semiconducting body.

16. The method of claim 15, wherein the forming of the drain contact to the drain dopant region comprises forming an etch mask overlying the gate structure and the portion of the conductive material that is in direct physical contact with the drain dopant region of the semiconducting body; removing portions of the first conductive material and the underlying dielectric material that are not protected by the etch mask with an anisotropic etch process; and depositing a second conductive material.

* * * * *